(12) United States Patent
Jordan, Jr. et al.

(10) Patent No.: US 9,699,917 B2
(45) Date of Patent: Jul. 4, 2017

(54) FORMULATED RESIN COMPOSITIONS FOR FLOOD COATING ELECTRONIC CIRCUIT ASSEMBLIES

(71) Applicant: Cytec Industries Inc., Woodland Park, NJ (US)

(72) Inventors: Richard David Jordan, Jr., Allegany, NY (US); Thomas C. Scanlon, IV, Hinsdale, NY (US)

(73) Assignee: Cytec Industries Inc. NJ (US)

( * ) Notice: Subject to any disclaimer, the term of this patent is extended or adjusted under 35 U.S.C. 154(b) by 222 days.

(21) Appl. No.: 14/292,876

(22) Filed: May 31, 2014

(65) Prior Publication Data

US 2014/0355225 A1 Dec. 4, 2014

Related U.S. Application Data

(60) Provisional application No. 61/829,681, filed on May 31, 2013.

(51) Int. Cl.

| | | |
|---|---|---|
| *C08G 18/24* | (2006.01) | |
| *C08G 18/48* | (2006.01) | |
| *C08G 18/76* | (2006.01) | |
| *C09D 175/04* | (2006.01) | |
| *H05K 3/28* | (2006.01) | |

(52) U.S. Cl.
CPC ........... *H05K 3/284* (2013.01); *C08G 18/246* (2013.01); *C08G 18/4825* (2013.01); *C08G 18/7664* (2013.01); *C09D 175/04* (2013.01); *H05K 3/285* (2013.01); *H05K 2201/09872* (2013.01)

(58) Field of Classification Search
CPC ................... H05K 3/284; H05K 3/285; H05K 2201/09872; C08G 18/4825; C08G 18/7664; C08G 18/246; C09D 175/04
See application file for complete search history.

(56) References Cited

U.S. PATENT DOCUMENTS

| | | | |
|---|---|---|---|
| 3,733,426 A | 5/1973 | Kaufman et al. | |
| 3,747,037 A | 7/1973 | Earing | |
| 3,962,094 A | 6/1976 | Davis et al. | |
| 4,008,197 A | 2/1977 | Brauer et al. | |
| 4,168,258 A | 9/1979 | Brauer et al. | |
| 4,170,559 A | 10/1979 | Kroplinski et al. | |
| 4,224,164 A | 9/1980 | Brauer et al. | |
| 4,256,617 A | 3/1981 | Kroplinski et al. | |
| 4,267,044 A | 5/1981 | Kroplinski et al. | |
| 4,284,506 A | 8/1981 | Tetenbaum et al. | |
| 4,300,184 A | 11/1981 | Colla | |
| 4,373,081 A * | 2/1983 | Nachtkamp | C08G 18/10 428/423.1 |
| 4,375,521 A | 3/1983 | Arnold | |
| 4,395,530 A | 7/1983 | Hammond | |
| 4,444,976 A * | 4/1984 | Rabito | C08G 18/10 528/60 |
| 4,454,176 A | 6/1984 | Buckfelder et al. | |
| 4,518,631 A | 5/1985 | Antonen | |
| 4,603,188 A | 7/1986 | Kusakawa et al. | |
| 4,842,736 A | 6/1989 | Bray et al. | |
| 4,865,735 A | 9/1989 | Chu et al. | |
| 4,876,303 A | 10/1989 | Chapin et al. | |
| 4,879,032 A | 11/1989 | Zemlin | |
| 4,886,600 A | 12/1989 | Chu et al. | |
| 4,923,756 A | 5/1990 | Chung et al. | |
| 5,266,145 A | 11/1993 | Duck et al. | |
| 5,288,797 A | 2/1994 | Khalil et al. | |
| 5,306,798 A * | 4/1994 | Horn | C08G 18/50 528/58 |
| 5,360,543 A | 11/1994 | Usifer et al. | |
| 5,556,934 A | 9/1996 | Hagquist et al. | |
| 5,863,597 A | 1/1999 | Lynch | |
| 5,871,822 A | 2/1999 | Lepsche et al. | |
| 6,130,268 A | 10/2000 | Murray | |
| 7,303,675 B2 | 12/2007 | De La Cruz | |
| 7,781,513 B2 | 8/2010 | Lucas et al. | |
| 8,360,390 B2 | 1/2013 | Fornage | |
| 8,822,844 B1 * | 9/2014 | Dimke | H05K 1/0219 174/386 |
| 2004/0012936 A1 | 1/2004 | Gravelin | |
| 2004/0072953 A1 | 4/2004 | Hung et al. | |

(Continued)

FOREIGN PATENT DOCUMENTS

| | | |
|---|---|---|
| CN | 102850989 | 1/2013 |
| CN | 102911636 | 2/2013 |

(Continued)

OTHER PUBLICATIONS

International Search Report for PCT/US2014/040421; mailing date Aug. 25, 2014.
Written Opinion for PCT/US2014/040421; mailing date Aug. 25, 2014.
International Search Report and Written Opinion for International Application No. PCT/US2015/019882, International Filing Date Mar. 11, 2015, Date of Mailing Jul. 3, 2015, 11 pages.

(Continued)

*Primary Examiner* — Patrick Niland
(74) *Attorney, Agent, or Firm* — Dennis J. Jakiela; Charles E. Bell (57) ABSTRACT

Formulated resin systems containing polymeric flood coat compositions are provided herein and characterized by having an initial mix thixotropic index from 1 to 5, and a gel time from 5 to 15 minutes such that when cured the compositions provide a Shore hardness from 15 A to 90 A, a thickness on horizontal surfaces from 20 mils to 75 mils, and a thickness on vertical surfaces from 4 mils to 20 mils. Electronic circuit assemblies flood coated with such formulated resin systems, and methods for protecting and supporting said assemblies, are also provided.

23 Claims, 3 Drawing Sheets

(56) References Cited

U.S. PATENT DOCUMENTS

| | | |
|---|---|---|
| 2004/0138402 A1 | 7/2004 | Thiele et al. |
| 2004/0198943 A1 | 10/2004 | Slack et al. |
| 2006/0076047 A1 | 4/2006 | Green et al. |
| 2008/0149257 A1* | 6/2008 | Tribelhorn ............. C08G 18/12 156/108 |
| 2009/0124751 A1 | 5/2009 | Lucas et al. |
| 2009/0242123 A1 | 10/2009 | Zhang et al. |
| 2013/0059082 A1 | 3/2013 | Wang et al. |
| 2014/0355225 A1 | 12/2014 | Jordan, Jr. et al. |
| 2015/0077947 A1* | 3/2015 | Jordan, Jr. ........... C09D 175/04 361/748 |
| 2015/0259583 A1 | 9/2015 | Kahle et al. |
| 2016/0145476 A1 | 5/2016 | Jordan, Jr. et al. |
| 2016/0298009 A1 | 10/2016 | Dey et al. |

FOREIGN PATENT DOCUMENTS

| | | |
|---|---|---|
| JP | H03217473 A | 9/1991 |
| JP | H0657236 A | 3/1994 |
| JP | 2006096912 | 4/2006 |
| WO | 2004035647 A1 | 4/2004 |
| WO | 2009020774 A1 | 2/2009 |
| WO | 2009039145 A1 | 3/2009 |
| WO | 2009123905 A1 | 10/2009 |
| WO | 2012010559 A1 | 1/2012 |

OTHER PUBLICATIONS

International Search Report for International Application No. PCT/US2015/062342, International Filing Date Nov. 24, 2015, Date of Mailing Apr. 7, 2016, 5 pages.
International Search Report for International Application No. PCT/US2016/026347, International Filing Date Apr. 7, 2016, Date of Mailing Jun. 1, 2016, 6 pages.
Written Opinion for International Application No. PCT/US2015/062342, International Filing Date Nov. 24, 2015, Date of Mailing Apr. 7, 2016, 5 pages.
Written Opinion for International Application No. PCT/US2016/026347, International Filing Date Apr. 7, 2016, Date of Mailing Jun. 1, 2016, 5 pages.
International Search Report for International Application No. PCT/US2014/067837; International Filing Date Nov. 29, 2014; Date of Mailing Feb. 23, 2015; 4 pages.
Written Opinion of the International Search Report for International Application No. PCT/US2014/067837; International Filing Date Nov. 29, 2014; Date of Mailing Feb. 23, 2015; 6 pages.

\* cited by examiner

FORMULATED RESIN COMPOSITIONS FOR FLOOD COATING ELECTRONIC CIRCUIT ASSEMBLIES

CROSS-REFERENCE TO RELATED APPLICATIONS

This application claims benefit of priority to U.S. Provisional Application No. 61/829,681 filed May 31, 2013, which is incorporated herein by reference in its entirety.

BACKGROUND OF THE INVENTION

1. Field of the Invention

The present invention generally relates to formulated resin systems, electronic circuit assemblies coated with such systems, and to methods for applying same.

More specifically, the present invention relates to protective polymeric films such as two part polyurethane resins for flood coating or encapsulating electronic circuit assemblies and other electronic devices that are part of a unitized construction, and which are susceptible to extreme environmental and/or mechanical degradation such as from vibration.

2. Description of the Related Art

There are a large assortment of two component filled or unfilled polymeric resin systems for potting and/or encapsulating of electrical circuit assemblies or other such electronic devices. Many of these formulations are based on similar technology using many of the same base raw materials to achieve desired properties during processing and/or at cure. The formulations are usually made up such materials as acrylic, polyurethane, silicone, or epoxy synthetic resins.

The main objective of a potting material is to provide protection and support of sensitive electronics in environments including exposure to chemical, high humidity, vibration, and temperature extremes. While these potting materials are successful, there is a need to reduce the weight and cost of such electronic assemblies. Potting materials are traditionally used to fill the device or assembly and, thus, are very thick. This feature can be considered disadvantageous for certain applications. Potted objects are also not easily re-enterable (i.e., soft enough to cut into for ease of removal for inspection and/or repair of the filled component). Accordingly, low hardness (soft), low modulus (elastic), vibration dampening polyurethane and silicone potting and encapsulation systems have been identified as the most desired materials for providing environmental protection and mechanical support of surface mount electronics that are subjected to such temperature extremes, as well as some level of vibration.

To this end, various manufacturers of electronic assemblies have chosen to use dielectric conformal coatings as their environmental protection barrier. Such conformal coatings are typically 2 mils (±1 mil) in thickness. Although this approach has proven successful in certain applications where a static environment exists, applications requiring mechanical support and environmental protection of large components exposed to temperature extremes and vibration have proven unsuccessful due to fatigue failure over time. The use of lead-free solder in electronic components has also contributed to the need for greater mechanical support and vibration dampening of large heavy electrical components.

The following U.S. Patents or Published Applications address some of the design challenges discussed above: U.S. Pat. Nos. 4,300,184; 5,863,597; 5,871,822; 8,360,390; and US2006/0076047.

Therefore, in an effort to fill the gap between thick and costly potting compounds and thin dielectric conformal coatings with little mechanical integrity, low hardness, low modulus formulated resin systems that are capable of providing mechanical structural support while providing vibrational dampening and reducing the overall resin weight and cost used in a conventionally potted assembly would be a useful advance in the art and could find rapid acceptance in any industry where use of potting and/or conformal coating systems are required.

SUMMARY OF THE INVENTION

The foregoing and additional objects are attained in accordance with the principles of the invention described herein, which provides, in one aspect polyurethane flood coat compositions ABCD formed by reacting a polyisocyanate prepolymer A, with a polyol B, which further contains a rheology agent/modifier C, and a catalyst D characterized in that when a ratio of part A is mixed with a ratio of part B the mixture provides a thixotropic index from 1 to 5; a gel time from 5 to 15 minutes; and a Shore hardness of 15 A to 60 A when cured.

In another aspect, the invention provides electrical circuit assemblies including a base support with a plurality of electrical circuit components extending outwardly from the surface of the base support attached thereto and electrically connected to the electrical circuitry, and polyurethane flood coat compositions ABCD as defined and described in detail herein, wherein the polyurethane flood coat composition completely covers and/or encapsulates the electrical circuit assembly as a fixed mass upon cure such that the thickness of the flood coat composition ABCD on component surfaces parallel (i.e., horizontal) to the base support is from 20 mils to 75 mils, and the thickness of the flood coat composition ABCD on component surfaces perpendicular (i.e., vertical) to the base support is from 4 mils to 20 mils.

In still another aspect, the present invention provides methods of encapsulating an electrical circuit assembly by pressurizing a flood coat composition ABCD as defined and described herein in detail at a predetermined pressure with an inert gas, applying a predetermined volume of the flood coat composition ABCD completely over said assembly at said predetermined pressure, allowing the flood coat composition ABCD to gel, and curing the coated assembly for a time and at a temperature sufficient to provide a Shore hardness of 15 A to 60 A.

These and other objects, features and advantages of this invention will become apparent from the following detailed description of the various aspects of the invention taken in conjunction with the accompanying Figures and Examples.

BRIEF DESCRIPTION OF THE DRAWINGS

So that the manner in which the above-recited features of the present invention can be understood in better detail, a more particular description of the invention may be had by reference to embodiments, some of which are illustrated or captured in the appended figures. It is to be noted, however, that the appended figures represent only typical embodiments of this invention and should not be considered limiting of its scope, for the invention may admit to other equally effective embodiments.

To facilitate understanding, identical reference numerals have been used, where possible, to designate identical elements that are common to the figures. The figures are not drawn or depicted to scale and may be simplified for clarity. Furthermore, it is contemplated that elements and features of one embodiment may be beneficially incorporated in other embodiments without further recitation.

DETAILED DESCRIPTION OF CERTAIN EMBODIMENTS OF THE INVENTION

As summarized above, the present invention pertains to the discovery of formulated resin systems possessing certain performance characteristics that are useful for protectively coating and/or encapsulating an electronic device such as a surface mount electronic device that is subject to harsh environments including exposure to chemical, high humidity, vibration, and temperature extremes. As discussed more fully below, the inventors have surprisingly discovered polymeric formulations that are based on dead elastomer/ energy absorbing chemistry back bones that provide low to moderate hardness and low modulus, and that reduce the overall resin weight and cost compared to conventionally potted devices, while simultaneously providing the same environmental protection, mechanical support, and vibrational dampening. Such advantages were heretofore thought unattainable without using a traditional potting material that completely fills the space where the electronic devise is housed. Accordingly, in view of the polymeric formulated resins described herein, the use of such products and flood coat processes can be used to replace potting materials where weight and overall cost due to the volume of resin is a concern, while still achieving desired performance properties.

Accordingly, in one aspect, the invention provides polymeric flood coat compositions ABCD formed by mixing part A with part B, wherein part A comprises a prepolymer, and part B comprises a polyol, a rheology agent/modifier C, and a catalyst D characterized in that when a ratio of part A is mixed with a ratio of part B the mixture possesses a thixotropic index from 1 to 5; a gel time from 5 to 15 minutes; and a Shore hardness of 15 A to 90 A when cured.

While the preferred compositions contemplated for use herein is a polyurethane flood coat composition, those of skill in the art will appreciate that any suitable polymeric resin may be used including, for example, acrylic, silicone, polysiloxane, and epoxy, as well as hybrids of these. In certain embodiments, the prepolymer of part A is a polyisocyanate containing prepolymer synthesized from a medium functionality polymeric diphenylmethane diisocyanate (pMDI) with an enhanced 2,4'-MDI isomer content A1 (such as that commercially available by Bayer Corp. under the tradename MONDUR® MRS, or other equivalent), reacted with a polypropylene glycol and benzoyl chloride as a stabilizer.

Other suitable polyisocyanates used to prepare the prepolymer of part A of the polyurethane composition include any compounds having at least two isocyanate moieties. Diisocyanates can be exemplified by 1,5-naphthylene diisocyanate, 4,4'-diphenylmethane diisocyanate (4,4'-MDI), 4,4'-diphenyldimethylmethane diisocyanate, 4,4'-dibenzyl diisocyanate, dialkyldiphenylmethane diisocyanate, 1,3-phenylene diisocyanate, 1,4-phenylene diisocyanate, toluene diisocyanate, butane-1,4-diisocyanate, hexamethylene diisocyanate, isopropylene diisocyanate, naphthylene diisocyanate, methylene diisocyanate, 2,2,4-trimethylhexamethylene diisocyanate, cyclohexane-1,4-diisocyanate, xylylene diisocyanate, hydrogenated xylylene diisocyanate, isophorone diisocyanate, lysine diisocyanate, dicyclohexylmethane-4,4'-diisocyanate, 1,3-bis(isocyanatomethyl)cyclohexane, methyl-cyclohexane diisocyanate, m-tetramethylxylylene diisocyanate, 2,4,6-triisopropylbenzene diisocyanate, isopropylidene bis(4-cyclohexylisocyanate), and mixtures thereof. Exemplary mixtures of diisocyanates include mixtures of 4,4'-MDI and 2,4-MDI.

The polyisocyanate used to prepare the part A prepolymer can also be a polyisocyanate prepared, for example, by reacting a diisocyanate with a diisocyanate-reactive compound such as a polyol e.g., a diol or polyamine, e.g., a diamine. Exemplary polyisocyanates used to prepare the part A prepolymer include polymeric forms of MDI. The polyisocyanate used to prepare the part A prepolymer can also be a carbodimide-modified diisocyanate, e.g., a carbodiimide-modified MDI. The polyisocyanate used to prepare the prepolymer of part A has an isocyanate (NCO) content that varies from 15% to 40% (mass percent) as measured by ASTM D2572, preferably from 10% to 20%.

The part A prepolymer is reacted with a polyol. In general, the polyol in part A is any polyol (i.e., a compound having more than one hydroxyl group appended thereto) that can react with an isocyanate group. More specifically, the polyol is preferably chosen from a group of polyols having a molecular weight of less than about 600. In one example, the polyol is chosen from a group of polyols having a weight average molecular weight from about 300 to about 600 Daltons. Examples of polyols include glycols, i.e., diols containing a 1,2 dihydroxy group such as ethylene glycol or propylene glycol and derivatives thereof, and glycerol or glycerin and derivatives thereof. Examples of polyols include polypropylene glycol and polytetramethylene ether glycol. In some embodiments, the polyol is an asymmetric diol having from 3 to 20 carbon atoms, more preferably 4 to 12 carbon atoms, and most preferably 5 to 10 carbon atoms. Examples of such asymmetric diols include, but are not limited to: 2-ethyl-1,3-hexanediol; 1,2-propanediol; 1,3-butanediol; 2,2,4-trimethyl-1,3-pentanediol, 1,12-octadecanediol; 1,2-hexanediol; 1,2-octanediol; and 1,2-decanediol. Further examples of polyols include a tetrol such as pentaerythritol. The polyol can also be a polyether polyol prepared from either ethylene oxide and/or propylene oxide optionally reacted with another polyol such as glycol or glycerol.

While polypropylene glycol (such as that commercially available from Lonza Corp. under the tradename POLY-G® 20-56) is a preferred polyol for use in part A in synthesizing the polyurethane backbone, those of skill in the art will recognize that other polyols are also suitable. Such other polyols include, for example, polybutadiene polyol. Examples of polybutadiene polyols include, but are not limited to, liquid hydroxyl terminated polymers of butadiene sold under the names Poly Bd® R-45HTLO and Poly Bd® R-20LM, both commercially available from Cray Valley USA, LLC, Exton, Pa., USA, as well as under the name Hypro™ 2800X95 HTB, commercially available from CVC Thermoset Specialties, Moorestown, N.J., USA.

In certain embodiments, the percentage of polymeric MDI and polypropylene glycol used to synthesize the polyurethane backbone of part A is from 40 to 60 wt. %, whereas the stabilizer is present in an amount of about 0.03 wt. %, based on the total wt. % of part A. In a particular embodiment, the percentage of polymeric MDI present is about 40 wt. % and the percentage of polypropylene glycol present is about 60 wt. %, based on the total wt. % of part A.

In the same or other embodiments, part B of the polymeric resin system can include a polyol that is present in an amount from 93 to 98 wt. %, based on the total wt. % of part B. In some embodiments, the polyol has less than 0.03 wt. % water. In the same or other embodiments, castor oil is the preferred polyol suitable for use with the present invention. The castor oil, i.e., ricinoleic acid triglyceride, is a renewable raw material that is widely commercially available. The invention also contemplates that a derivative of castor oil includes any polyol derived from castor oil, which includes a hydrolysis product, an ethoxylated product, a transesterfied product, or an esterfied product, or a polyamide product. Other suitable polyols will be known to those of skill in the art, however, and it is contemplated that the polyols suitable for use in part B also include those polyols described above for part A, wherein the polyols may be the same or different.

The polyol of part B is further formulated with a rheology agent C and a catalyst D. The rheology agent includes all synthetic and natural anti-sagging additives from BYK Additives/Elements Specialties, Wallingford, Conn., USA, along with primary amine-terminated polyether compounds. Primary amine-terminated polyether compounds include, but are not limited to polyoxypropylene amine having a weight average molecular weight from about 110 or 200 Da, to preferably about 500 Da (although molecular weights up to about 2000 Da are also suitable) and an amine functionality of about 2 to 3, preferably about 2. Such primary amino-terminated polyethers are manufactured and sold by Huntsman Corporation, Salt Lake City, Utah, under the name Jeffamine. Particularly preferred is Jeffamine D-230, which is a polyoxypropylene glycol terminated with primary amines and having an amine functionality of 2 and a molecular weight of about 230. Crosslinking in the adhesive composition can be further accelerated by adding a hydroxyl-containing tertiary amine such as diisoproponol amine commercially available as QUADROL by BASF Corp., Germany. Thixotropy develops rapidly when part A and part B are mixed together in the presence of such amines. Rheology agents (or thixotropic agents) also include, but are not limited to, inorganic additives and can include, for example, fumed silica, amorphous silicon dioxide, clays, bentonites, talcs, and the like, and combinations thereof.

The urethane catalyst D of part B of the polyurethane composition may be any urethane catalyst. Examples of urethane catalysts include tin catalysts such as dialkyl tin dialkanoates, for example, FOMREZ® catalyst UL-28 (dimethyltin dineodecanoate), which provides very short gel and tack-free times as well as good solubility in polyurethane systems. Other examples of urethane catalysts include, but are not limited to: stannous octoate, commercially available as DABCO® T-9 from Air Products, Allentown, Pa., USA; organotin, commercially available as DABCO® 131 from Air Products, Allentown, Pa., USA; 1,4-diazabicyclooctane, available as DABCO® Crystalline Catalyst from Air Products, Allentown, Pa., USA; n-cetyl-n,n-dimethylamine, available as DABCO® B-16 from Air Products, Allentown, Pa., USA; dibutyltin dilaurate, available as DABCO® T-12 from Air Products, Allentown, Pa., USA; dibutyltin diacetate, available as METACURE™ T-1 catalyst from Air Products, Allentown, Pa., USA; a blend of zinc neodecanoate, bismuth neodecanoate and neodecanoic acid, available as BiCAT® 8 from Shepherd Chemical Company, Norwood, Ohio, USA; ferric acetylacetonate, available as AMSPEC® GCR-56 from Amspec Chemical Corporation, Bear, Del., USA; and oleic acid, available as Oleic Acid 105 from Acme-Hardesty Company, Blue Bell, Pa., USA.

In certain embodiments, the rheology agent C contains from 2 to 6 wt. % of fumed silica, based on the total wt. % of part B (such as that commercially available from Cabot Corp. under the tradename CAB-O-SIL® M-5), and the catalyst D contains from 0.2 wt. % to 0.5 wt. % (based on the total weight of part B), of an organo-metallic catalyst such as dibutyltin acetate. While these are understood to be preferred embodiments, the specific rheology agent/modifier and/or catalyst are not critical as other suitable agents and catalysts discussed above can be used. Rather, what is important is to have the gel time and the rheology be in close proximity in order to achieve the vertical build (i.e., on the elongated circuit components projecting outwardly from the base of the circuit board or other such electronic device) desired for environmental protection, while allowing adequate flow to achieve a horizontal build sufficient to provide the desired mechanical support when the flood coat composition is cured.

Accordingly, in certain embodiments, the thixotropic index can be from 1 to 5, and preferably from 1.20 to 3.50, and more preferably from 1.22 to 1.23. As used herein, the term "thixotropic index" is refers to the viscosity measured at 2.5 RPM divided by the viscosity measured at 20 RPM of a mix ratio of part A and part B, where the appropriate weight amounts of part A and part B are mixed by hand for 1-2 minutes at 25° C., and the viscosity of the mixture is determined using a Brookfield viscometer with a #7 spindle at 2.5 RPM, and then at 20 RPM.

In same or other embodiments, the gel time is from 5 to 15 minutes, and preferably from 5 to 12. In same or other embodiments, the initial viscosity of the mix ratio of part A and part B is from 15,000 to 18,000 cps, and preferably from 15,000 to 16,500 cps. It is contemplated that elements and features of one embodiment may be beneficially incorporated in other embodiments without further recitation. It is further contemplated that part A and part B can be mixed in any ratio or amount.

Part A and/or part B of the flood coat compositions contemplated herein may also contain other suitable fillers or additives. Either or both part A and part B of the may also include a defoamer. In one embodiment, a defoamer is added in an amount from about 0.01 to about 0.1 wt. % to part A. In another embodiment, a defoamer is added in an amount from about 0.01 to about 0.1 to part B. In a further embodiment, a defoamer is added in an amount from about 0.005 to about 0.05 to part A, and in an amount from about 0.005 to about 0.05 to part B. The defoamer utilized in either or both part A and part B may be any defoamer that is known in the art. In one example, the defoamer is a silicone based defoamer, such as, for example, an alkyl aryl silicone polymer-based antifoaming additive, commercially available as SF8843 from Momentive Performance Materials Holdings LLC, Columbus, Ohio, USA. In another embodiment, the defoamer is a silicone free defoamer, such as an isoparaffin based defoamer, such as, for example, BYK 054, available from BYK USA, Inc., Wallingford, Conn., USA.

The filler may be any suitable filler known in the art, including, but not limited to talc, calcium carbonate, barium sulfate, magnesium hydroxide, clay, mica, titanium dioxide, or any combination of the foregoing.

Figure 1:
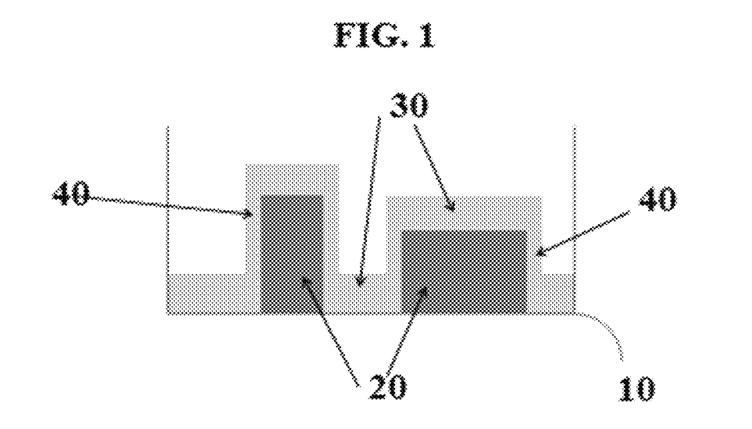
FIG. 1 illustrates a cross-section perspective view of an electronic circuit board assembly having tall electric circuit components extending outwardly from the surface of a base support with a flood coat composition as described herein applied thereto.

In another aspect, and with reference to FIG. 1, the invention provides electrical circuit assemblies including a base support 10 with a plurality of electrical circuit components 20 extending outwardly from the surface of the base support 10 attached thereto and electrically connected to the electrical circuitry (not shown), and polyurethane flood coat compositions ABCD as defined and described in detail herein, wherein the polyurethane flood coat composition completely covers and/or encapsulates the electrical circuit assembly as a fixed mass upon cure such that the thickness of the flood coat composition ABCD on component surfaces parallel (i.e., horizontal) 30 to the base support is from 20 mils to 500 mils, and the thickness of the flood coat composition ABCD on component surfaces perpendicular (i.e., vertical) 40 to the base support is from 4 mils to 20 mils. As those skilled in the art will appreciate, the units "mils" as used herein (also known as "thous") refers to an imperial length unit and is equal to $\frac{1}{1000}$ of an inch.

In certain embodiments the thickness of the flood coat composition on component surfaces perpendicular to the base support is greater than 4 mils and less than 20 mils, and preferably less than 10 mils. In same or other embodiments, the thickness of the flood coat composition on component surfaces horizontal to the base support is greater than 20 mils and less than 75 mils, preferably greater than 40 mils and less than 60 mils. It is contemplated that elements and features of one embodiment may be beneficially incorporated in other embodiments without further recitation.

Again, obtaining these key characteristics is done by controlling the reactivity (i.e., gel time) and the rheology to allow the resin system to be applied manually or through automation (i.e., a flood coat process, wherein the resin can be dispensed in the form of a ribbon or curtain), which allows it to cover all components flowing down vertical surfaces while maintaining a 4 mils to 10 mils build on all vertical surfaces.

While flowing down the vertical surfaces, the resin will build at a thickness from 20 mils to 500 mils on the horizontal surfaces, thereby providing mechanical support of large components as well.

Figure 2A:
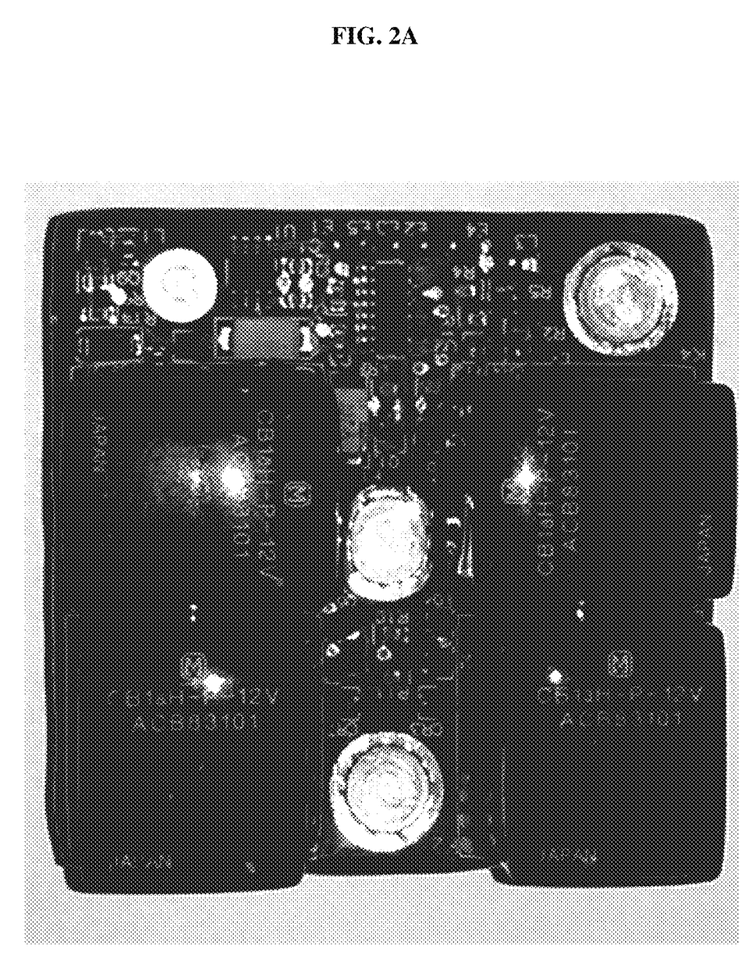
FIGS. 2A-2B together depict a top and side view, respectively, of an actual electronic circuit assembly with a protective flood coat composition as described herein applied thereto and effectively encapsulating the assembly and the electronic circuitry.
Figure 2B:
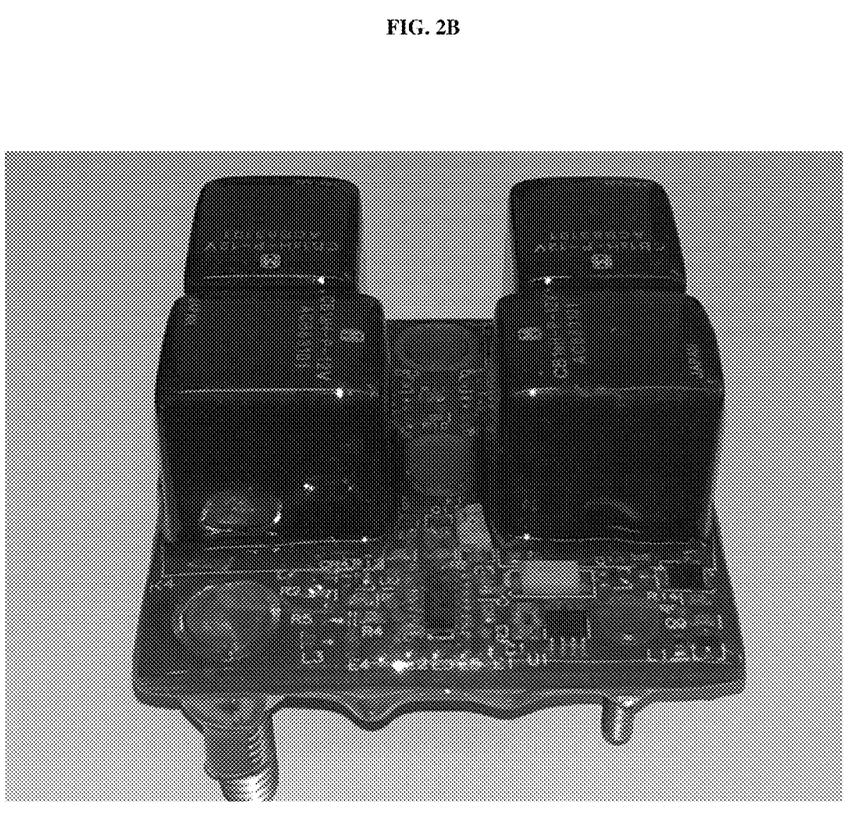

While the formulated flood coat resin system described herein is suitable for use with any electrical circuit assembly, exemplary devices include, but are not limited to, electrical circuit boards used in PCs, inverters (e.g., micro solar inverters), converters, power supplies, and the like. Reference is given to FIGS. 2A-2B.

In still another aspect, the present invention provides methods of encapsulating or flood coating an electrical circuit assembly by pressurizing a flood coat resin system composition ABCD as defined and described herein in detail at a predetermined pressure with an inert gas, applying a predetermined volume of the flood coat composition ABCD completely over said assembly at said predetermined pressure, allowing the flood coat composition ABCD to gel, and curing the coated assembly for a time and at a temperature sufficient to provide a Shore hardness of 15 A to 90 A.

In certain embodiments the pressure applied is 30 psi and the inert gas is dry nitrogen. In same or other embodiments, the curing step is from 5 to 7 days at a temperature of 25° C.

As discussed previously, the flood coat compositions are suitable for use with electronic assemblies and components in applications requiring mechanical support and environmental protection due to exposure to temperature extremes and vibration, which cause fatigue failure of the assemblies over time. Accordingly, in another aspect, the invention provides methods of preventing failure of an electrical circuit assembly due to exposure to temperature extremes (i.e., rapid increases or decreases in temperature and/or prolonged exposure to extreme cold and/or heat) and vibration by applying a predetermined volume of a polyurethane flood coat composition as described and contemplated herein completely over the electrical circuit assembly, allowing the flood coat composition to gel, and curing the flood coat composition as a fixed mass on the electrical circuit assembly such that the thickness of the flood coat composition on component surfaces horizontal to the base support of the assembly is from 20 mils to 75 mils, and the thickness of the flood coat composition on component surfaces perpendicular to the base support is from 4 mils to 20 mils. This aspect of the invention can be alternatively written as providing mechanical support and environmental protection to an electrical circuit assembly exposed to temperature extremes and vibration.

EXAMPLES

The following examples are provided to assist one skilled in the art to further understand certain embodiments of the present invention. These examples are intended for illustration purposes and are not to be construed as limiting the scope of the various embodiments of the present invention.

Example 1—Preparation of Polymeric Resin

A two part polyurethane resin system is prepared as follows: In Part A, 41.10 parts by weight (based on the total weight of part A) of a medium functionality polymeric diphenylmethane diisocyanate (pMDI) having an enhanced 2,4'-MDI isomer content and isocyanate group (N=C=O) of 31 to 32 wt. % (based on a total weight of the diisocyanate) (such as MONDUR® MRS available from Bayer Corp. or equivalent) is reacted with 58.87 parts by weight (based on the total weight of part A) of polypropylene glycol (such as PolyG-20-56 available from Lonza Corporation, or equivalent), and 0.03 parts by weight (based on the total weight of part A) benzoyl chloride as a stabilizer to form an MDI prepolymer having an N=C=O content ranging between 10 to 12 wt. % (based on a total weight of the diisocyanate), inclusive. The reaction is performed at a temperature of 80-85° C. under a vacuum of >27" Hg for 4 hours.

In part B, 93.57 parts of castor oil is dried by heating it at a temperature from 100-110° C. under a vacuum of >27" Hg for 1-2 hours in order to obtain a water content of <0.03 wt. %. A thixotropic agent such as fumed silica (available as CAB-O-SIL® M-5 from Cabot Corporation) at 6 parts by weight (based on the total weight of part B) is dried in an oven at 130° C. for 24 hours. The thixotropic agent is then mixed with the dry castor oil under a high speed (3000 rpm) shear for 45 minutes in order to achieve a desired rheology—thixotropic index of 1.22. 0.41 parts by weight (based on the total weight of part B) of a metallic catalyst such as tin-based dibutyltin diacetate (available as METACURE® T-1 from Air Products) is added to control the gel time when parts A and B are mixed. Parts A and B are mixed at a ratio of 44.25 wt. % of part A to 55.75 wt. % of part B.

Particulars of the formulation are provide below in Table 1:

TABLE 1

| PolyUrethane Flood Coat | Invention |
|---|---|
| Part A | wt. % (on A) |
| Diisocyanate (Mondur MRS-4) | 41.10 |
| Polyether Diol (Poly-G-20-56-U) | 58.87 |
| Benzoyl Chloride | 0.03 |
| Part A prepolymer NCO | 10-12% |
| Part A prepolymer viscosity (cps) | 15,000-18,000 |
| Part B | wt. % (on B) |
| Castor Oil Polyol | 93.57 |
| Alkyl aryl siloxane (defoamer) (SF8843) | 0.02 |
| Dibutyl-Tin Acetate (Metacure T1 Catalyst) | 0.41 |
| Fumed Silica (Cab-o-Sil M5) | 6.0 |
| Part B mixture viscosity (cps) | 1,092 |
| Mix Ratio by Weight | 44.25 parts A/55.75 parts B |
| Part A + B mixture initial viscosity (cps) | 16,000 |
| Shore Hardness | 35A |
| Thixotropic Index | 1.22 |
| Average Coating Weight (grams) | 93.1 |
| Horizontal Thickness (mils = 1/1000 inch) | 20 |
| Vertical Thickness (mils = 1/1000 inch) | 4-5 |

Example 2—Flood Coating an Electronic Assembly

A 400 ml cartridge of a square style, 30 element static mixer, fitted with a 1" spade/flat tip, is filled with a polymeric resin such as that prepared according to Example 1. Dry nitrogen at 30 psi is applied to the resin. A solar micro inverter weighing 1,853.00 grams is provided and the polymeric resin is applied through a dispensing gun that is held at an approximately 45° angle to the surface of the board. The polymeric resin "flood coats" the electrical circuit board and components as it is dispensed in the form of a ribbon or curtain and allowed to cover all components flowing down vertical surfaces, while maintaining a 4 mils to 5 mils build on all vertical surfaces due to rheology and reactivity control. While flowing down the vertical surfaces, the resin builds at a thickness of 20 mils on horizontal surfaces, thereby resulting in mechanical support of large components. The coating time from start to finish is about 5 minutes. The gel time is approximately 10-12 minutes, and the full cure time is about 7 days at 25° C. The weight of the solar micro inverter after flood coating is 2, 200.00 grams (i.e., 347.96 grams of polymeric resin material used).

Thus, using the polymeric flood coat resin composition and process described herein, the same environmental protection and mechanical support as that provided by conventional potting resin is achieved, while reducing the overall weight and resin cost used in a conventionally potted device by >50%.

Various patent and/or scientific literature references have been referred to throughout this application. The disclosures of these publications in their entireties are hereby incorporated by reference as if written herein. In the case of conflicting terms, the terms of this document will take preference. In view of the above description and the examples, one of ordinary skill in the art will be able to practice the invention as claimed without undue experimentation.

Although the foregoing description has shown, described, and pointed out the fundamental novel features of the present teachings, it will be understood that various omissions, substitutions, and changes in the form of the detail of the composition and apparatus as illustrated, as well as the uses thereof, may be made by those skilled in the art, without departing from the scope of the present teachings, due to the fact that actual needs and requirements for specific applications will vary. Consequently, the scope of the present teachings should not be limited to the foregoing discussion, but should be defined by the appended claims. Although the claims may be written to be singly dependent upon another claim, the invention as contemplated herein includes all such embodiments as if the claims were written to be multiply dependent as well.

What is claimed is:

1. A polyurethane flood coat composition ABCD comprising
    a polyisocyanate prepolymer as part A; and
    in part B, a polyol; 2 to 6 wt. % of a rheology agent C, based on the total weight of part B; and a catalyst D, characterized in that when a ratio of part A is mixed with
        a ratio of part B the mixture provides an initial viscosity of the mixture of part A and part B of from 15,000 to 18,000 cps; a thixotropic index from 1 to 5; a gel time from 5 to 15 minutes; and a Shore hardness of 15 A to 90 A when cured.

2. The polyurethane flood coat composition ABCD according to claim 1, wherein the polyisocyanate prepolymer A comprises from 50-60 wt. % of polymeric diphenylmethane diisocyanate A1; from 40-50 wt. % of polypropylene glycol A2; and a stabilizer compound A3, based on the total weight of part A.

3. The polyurethane flood coat composition ABCD, according to claim 2, wherein the stabilizer compound A3 is benzoyl chloride.

4. The polyurethane flood coat composition ABCD according to claim 1, wherein the polyisocyanate prepolymer A contains from 10 to 12 wt. % isocyanate (N=C=O) groups, based on the total weight of the polyisocyanate.

5. The polyurethane flood coat composition ABCD according to claim 1, wherein the polyol B is castor oil.

6. The polyurethane flood coat composition ABCD according to claim 1, wherein the rheology agent C comprises fumed silica.

7. The polyurethane flood coat composition ABCD according to claim 1, wherein the catalyst D is an organo-metallic catalyst.

8. The polyurethane flood coat composition ABCD according to claim 7, wherein the organo-metallic catalyst is dibutyltin diacetate.

9. The polyurethane flood coat composition ABCD according to claim 1, wherein the Shore hardness is from 40 A to 60 A.

10. The polyurethane flood coat composition ABCD according to claim 1, wherein the thixotropic index is from 1.2 to 3.5.

11. The polyurethane flood coat composition ABCD according to claim 1, wherein the gel time is from 5 to 12 minutes.

12. An electrical circuit assembly comprising:
    a base support with a plurality of electrical circuit components extending outwardly from the surface of the base support attached thereto and electrically connected to the electrical circuitry, and
    the polyurethane flood coat composition ABCD as defined in claim 1,
    wherein the polyurethane flood coat composition ABCD completely covers or encapsulates the electrical circuit assembly as a fixed mass upon cure such that the thickness of the polyurethane flood coat composition ABCD on component surfaces horizontal to the base support is from 20 mils to 75 mils, and the thickness of the polyurethane flood coat composition ABCD on component surfaces perpendicular to the base support is from 4 mils to 20 mils.

13. An electrical circuit assembly according to claim 12, wherein the thickness of the polyurethane flood coat composition ABCD on component surfaces perpendicular to the base support is greater than 4 mils and less than 10 mils.

14. An electrical circuit assembly according to claim 12, wherein the thickness of the polyurethane flood coat composition ABCD on component surfaces horizontal to the base support is greater than 20 mils and less than 70 mils.

15. An electrical circuit assembly according to claim 12, wherein the polyurethane flood coat composition ABCD has a Shore hardness of 40 A to 60 A when cured.

16. An electrical circuit assembly according to claim 12, wherein said electrical circuit assembly is situated within an electronic device.

17. An electrical circuit assembly according to claim 16, wherein the electronic device is selected from the group consisting of inverters, converters, and power supplies.

18. A method of encapsulating an electrical circuit assembly, the method comprising:
  pressurizing the polyurethane flood coat composition ABCD as defined in claim 1 at a predetermined pressure with an inert gas;
  applying a predetermined volume of the polyurethane flood coat composition ABCD over said complete assembly at said predetermined pressure;
  allowing the polyurethane flood coat composition ABCD to gel; and
  curing the coated assembly for a time and at a temperature sufficient to provide a Shore hardness of 15 A to 60 A.

19. A method according to claim 18, wherein the pressure is 30 psi.

20. A method according to claim 18, wherein the inert gas is nitrogen.

21. A method according to claim 18, wherein the curing step is from 5 to 7 days at 25° C.

22. A method of providing mechanical support and environmental protection to an electrical circuit assembly exposed to temperature extremes and vibration, the method comprising:
  applying a predetermined volume of a polyurethane flood coat composition ABCD as defined in claim 1 completely over said electrical circuit assembly;
  allowing the polyurethane flood coat composition ABCD to gel; and
  curing the polyurethane flood coat composition ABCD as a fixed mass on the electrical circuit assembly for a sufficient time and at a sufficient temperature such that upon cure the thickness of the flood coat composition ABCD on component surfaces horizontal to the base support of the assembly is from 20 mils to 75 mils, and the thickness of the polyurethane flood coat composition ABCD on component surfaces perpendicular to the base support of the assembly is from 4 mils to 20 mils.

23. A polyurethane flood coat composition ABCD comprising
  a polyisocyanate prepolymer having from 10 to 12 wt. % isocyanate (N=C=O) groups, based on the total weight of the polyisocyanate prepolymer, as part A; and
  in part B, a polyol; and based on the total weight of part B, 2 to 6 wt. % of fumed silica C and 0.2 to 0.5 wt. % of an organo-metallic catalyst D,
  characterized in that when a ratio of part A is mixed with a ratio of part B the mixture provides an initial viscosity of the mixture of part A and part B of from 15,000 to 18,000 cps;
  a thixotropic index from 1 to 5; a gel time from 5 to 15 minutes; and a Shore hardness of 15 A to 90 A when cured.

* * * * *